(12) United States Patent
Asai et al.

(10) Patent No.: US 8,610,060 B2
(45) Date of Patent: Dec. 17, 2013

(54) CHARGED PARTICLE BEAM DEVICE

(75) Inventors: Suyo Asai, Mito (JP); Tsuyoshi Onishi, Hitachinaka (JP); Toshihide Agemura, Tsuchiura (JP)

(73) Assignee: Hitachi High-Technologies Corporation, Tokyo (JP)

( * ) Notice: Subject to any disclaimer, the term of this patent is extended or adjusted under 35 U.S.C. 154(b) by 178 days.

(21) Appl. No.: 13/202,554

(22) PCT Filed: Oct. 23, 2009

(86) PCT No.: PCT/JP2009/005581
§ 371 (c)(1),
(2), (4) Date: Aug. 19, 2011

(87) PCT Pub. No.: WO2010/097861
PCT Pub. Date: Sep. 2, 2010

(65) Prior Publication Data
US 2011/0297827 A1 Dec. 8, 2011

(30) Foreign Application Priority Data
Feb. 27, 2009 (JP) .................................. 2009-045048

(51) Int. Cl.
H01J 37/31 (2006.01)
H01J 37/00 (2006.01)

(52) U.S. Cl.
USPC ............................. 250/311; 250/306; 250/310

(58) Field of Classification Search
USPC ..................... 250/306, 310, 311, 492.21, 307
See application file for complete search history.

(56) References Cited

U.S. PATENT DOCUMENTS

| | | | |
|---|---|---|---|
| 6,825,468 B2* | 11/2004 | Oi et al. | 250/311 |
| 2008/0296498 A1* | 12/2008 | Hong | 250/311 |
| 2011/0031396 A1* | 2/2011 | Zaykova-Feldman et al. | 250/307 |
| 2011/0226947 A1* | 9/2011 | Takahashi et al. | 250/307 |
| 2012/0001069 A1* | 1/2012 | Kashihara | 250/310 |
| 2012/0001070 A1* | 1/2012 | Takagi | 250/310 |
| 2012/0043463 A1* | 2/2012 | Agemura et al. | 250/310 |

FOREIGN PATENT DOCUMENTS

| | | |
|---|---|---|
| JP | 56-132756 | 10/1981 |
| JP | 59-201356 | 11/1984 |
| JP | 2002-150990 | 5/2002 |
| JP | 2008-210702 | 9/2008 |

* cited by examiner

Primary Examiner — Nikita Wells
Assistant Examiner — Johnnie L Smith
(74) Attorney, Agent, or Firm — McDermott Will & Emery LLP

(57) ABSTRACT

An object of the present invention is related to detecting of a detection signal at an optimum position in such a case that a sample plane is inclined with respect to a charged particle beam.
The present invention is related to a charged particle beam apparatus for irradiating a charged particle beam to a sample, in which a detector is moved to a plurality of desirable positions around the sample so as to optimize positions of the detector. In accordance with the present invention, since it is possible to obtain an optimum detection signal in response to an attitude and a shape of the sample, a highly accurate sample observation, for instance, an SEM observation, an STEM observation, and an FIB observation can be carried out. Moreover, in an FIB-SEM apparatus, it is possible to highly accurately detect an end point of an FIB process.

6 Claims, 3 Drawing Sheets

(FRONT VIEW)

(SIDE VIEW)

(FRONT VIEW)

(SIDE VIEW)

CHARGED PARTICLE BEAM DEVICE

RELATED APPLICATIONS

This application is the U.S. National Phase under 35 U.S.C. §371 of International Application No. PCT/JP2009/005581, filed on Oct. 23, 2009, which in turn claims the benefit of Japanese Application No. 2009-045048, filed on Feb. 27, 2009, the disclosures of which Applications are incorporated by reference herein.

TECHNICAL FIELD

The present invention is related to a charged particle beam apparatus capable of irradiating an ion beam, an electron beam, and the like.

BACKGROUND

To analyze defects of semiconductors and the like and analyze physical properties of materials, there is such a trend that scanning electron microscopes (will be referred to as "SEM" hereinafter), scanning transmission electron microscopes (will be referred to as "STEM" hereinafter), and transmission electron microscopes (will be referred to as "TEM" hereinafter) are employed which can perform high-precision observations.

More specifically, in order to observe predetermined portions, there are many cases that the predetermined portions are cut out from samples by employing focused ion beam (will be referred to as "FIB" hereinafter) apparatuses to manufacture STEM, or TEM observation-purpose thin-film samples, and the manufactured thin-film samples are observed by STEMs, or TEMs.

Then, very recently, since semiconductor devices are manufactured in higher integration degrees, higher observations are required and end points of processes by FIBs are required to be more precisely sensed, so that FIB-SEM (dual beam) apparatuses corresponding to FIB apparatuses constructed by adding SEMs are utilized.

JP-A-2002-150990 publication (patent literature 1) discloses a minute sample working observation apparatus equipped with a focused ion beam optical system, an electron beam optical system, a sample stage for mounting a sample, and a second sample stage for holding a minute sample extracted from the sample worked by the focused ion beam, in which an angle of the second sample stage is adjusted in such a manner that the minute sample becomes a proper angle with respect to the electron beam.

CITATION LIST

Patent Literature

Patent Literature 1: JP-A-2002-150990

SUMMARY OF INVENTION

Technical Problem

The Inventors of the present invention have deeply considered high precision sample observations in FIB-SEM apparatuses, more specifically, relationships between charged particle beams and incident angles thereof with respect to sample planes. As a result, the Inventors could have obtained the below-mentioned knowledge.

In an apparatus having one, or more charged particle beam optical systems, in the case where sample planes are inclined by sample stages, or the like, optimum positions of detection signals with respect to beams are changed. When deep positions of opening portions (holes and grooves) of samples are observed and processed, if positions of detectors are fixed, then there are some possibilities that necessary signal strengths cannot be secured.

More specifically, while an FIB-SEM apparatus having a point (cross point) where both an ion beam of an ion beam electronic optical system intersects an electron beam of an electron beam electronic optical system mainly processes and observes a sample at the cross point, both the optical systems are disposed at a certain angle (for instance, 60 degrees) in order that both the optical systems do not physically interfere with each other by defining a position of the sample as a center. As a result, an optimum position of the detector for the ion beam is different from that for the electron beam with respect to one observation sample plane, so that signals can be more hardly acquired in high efficiencies.

An object of the present invention is related to a technical idea by which in the case that a sample plane is inclined with respect to a charged particle beam, detection signals are detected at optimum positions.

Solution to Problem

The present invention is related to a technical idea by which in a charged particle beam apparatus for irradiating a charged particle beam to a sample, a detector is moved to a plurality of desired positions around the sample so as to optimize positions of the detector.

Advantageous Effects of Invention

In accordance with the present invention, since it is possible to obtain an optimum detection signal in response to an attitude and a shape of the sample, a highly accurate sample observation, for instance, an SEM observation, an STEM observation, and an FIB observation can be carried out.

Moreover, in the FIB-SEM apparatus, it is possible to highly accurately detect an end point of an FIB process.

DESCRIPTION OF EMBODIMENTS

Figure 1:
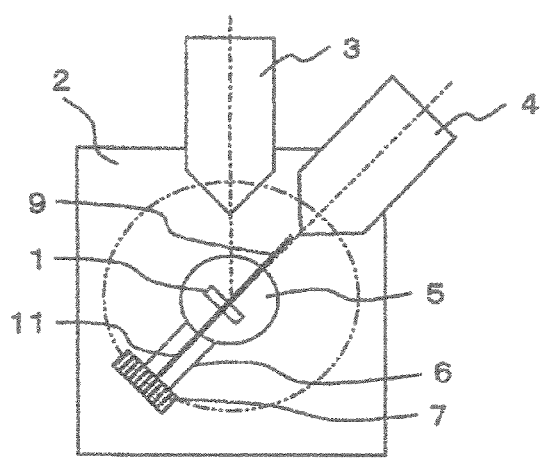
FIG. 1 is a system structural diagram of an FIB-SEM apparatus according to an embodiment 1.

An embodiment discloses a charged particle beam apparatus equipped with a rotatable sample stage, and a detector for detecting a signal from a sample, in which the above-described detector can be rotated around the sample stage as a center.

Also, an embodiment discloses a charged particle beam apparatus equipped with an electron beam optical system for irradiating an electron beam and an ion beam optical system for irradiating an ion beam, in which a detector can be rotated around a cross point of the electron beam optical system and the ion beam optical system as a center.

Also, an embodiment discloses a charged particle beam apparatus in which a detector can be moved to a position on an optical axis of an electron beam optical system, through which an electron beam penetrated into a sample passes. Preferably, a sample stage may be rotated in such a manner that a sample plane of a sample held by the sample stage is directed to the electron beam optical system.

Also, an embodiment discloses a charged particle beam apparatus in which a detector can be moved to a position at which an optical axis of an electron beam and a major axis of the detector have line symmetry with respect to an optical axis of an ion beam optical system. Preferably, a sample stage may be rotated in such a manner that a sample plane of a sample which is held by the sample stage is directed to the ion beam optical system.

Also, an embodiment discloses a charged particle beam apparatus in which a detector can be moved to a position at which a major axis of an electron beam optical system and a major axis of the detector have line symmetry with respect to a normal of a sample plane. Preferably, a sample stage may be rotated in such a manner that the sample plane of the sample which is held by the sample stage is located parallel to an optical axis of an ion optical system.

Also, an embodiment discloses a charged particle beam apparatus in which a detector can be moved to a position at which a major axis of an ion beam optical system and a major axis of the detector have line symmetry with respect to a normal of a sample plane.

Preferably, a sample stage may be rotated in such a manner that the sample plane of the sample which is held by the sample stage is directed to an electron beam optical system.

Also, an embodiment discloses a charged particle beam apparatus in which a detector can acquire a penetration electron image and a secondary particle image.

Also, an embodiment discloses a charged particle beam apparatus in which a detector can be expanded/compressed along a rotational radius direction.

Also, an embodiment discloses a charged particle beam apparatus in which a detector can be evacuated in a direction along which the detector is separated apart from a sample stage.

Also, an embodiment discloses a charged particle beam apparatus equipped with an ion beam optical system, an electron beam optical system, a sample stage capable of changing an inclination direction of a sample to be held, and a detector for detecting a signal from the sample, in which the detector can be moved to a position on an optical axis of the electron beam optical system, through which an electron beam penetrated into the sample passes; a position at which an optical axis of an electron beam and a major axis of the detector have line symmetry with respect to an optical axis of the ion beam optical system; a position at which a major axis of the electron beam optical system and the major axis of the detector have line symmetry with respect to a normal of a sample plane; and a position at which the major axis of the electron beam optical system and the major axis of the detector have line symmetry with respect to the normal of the sample plane.

Referring now to drawings, a description is made of the above-described and other novel features of the present invention, and advantageous effects thereof. It should be understood that while respective embodiments may be properly combined with each other, the present specification also discloses the above-described combined modes.

Embodiment 1

FIG. 1 is a diagram for schematically showing a charged particle beam apparatus according to the present embodiment, and an internal portion of the apparatus is partially prospectively drawn.

The charge particle beam apparatus is equipped with an FIB lens barrel 3 for generating an ion beam which observes and processes a sample 1 and a probe, an SEM lens barrel 4 for generating an electron beam used to observe surface shapes of the sample 1 and the probe, a sample chamber 2, a sample stage 5 which mounts the sample; a probe driving unit for moving the probe in a very line mode within the sample chamber 2, a detector stage 6 for holding a detector 7, a deposition gas source, a display, and a calculating process unit.

The FIB lens barrel 3 can observe, or process surfaces of the sample 1 and the probe by shaping ions generated from an ion source so as to form an ion beam and by irradiating the ion beam to the sample 1 and the probe. The SEM lens barrel 4 can observe surfaces of the sample 1 and the probe by shaping electrons generated from an electron source so as to form an electron beam and by irradiating the electron beam to the sample 1 and the probe. Since both columns are disposed in such a manner that an irradiation position of the electron beam from the SEM lens barrel 4 becomes substantially equal to an irradiation position of the ion beam from the FIB lens barrel 3, a processing portion by the ion beam can be observed by the electron beam.

The sample stage 5 can mount thereon the sample 1, can move the sample 1 on a plane, and can rotationally move the sample 1. Also, the sample stage 5 can move a portion to an ion beam irradiation position, which is required to be processed and to be observed by the ion beam, and can move the above-described portion to an observation position by the electron beam. It should be understood that as the sample 1, steel, light metals, polymer-series macromolecule, and the like may be assumed in addition to semiconductor samples.

While the probe can be moved within the sample chamber 2 by the probe driving unit, the probe is utilized so as to extract a minute sample piece formed in a sample, and to apply a potential to a sample by being contacted to a surface of the sample.

While the deposition gas source stores therein a deposition gas for forming a deposited film by irradiating a charged particle beam, the deposition gas source can supply the deposition gas from a nozzle tip, if necessary.

The detector 7 is such a detector as to secondary electrons, secondary ions, backward scattering electrons, X-rays, reflection electrons, penetration electrons, and the like, which are generated from an irradiated portion such as a sample and a probe by being irradiated by an ion beam and an electron beam. Since these detection signals are calculated/processed by the calculating process unit so as to produce images thereof, a secondary electron image, a secondary ion image, an element map made by characteristic X-rays, a penetration electron image, and the like are displayed on a display. Also, the calculating process unit can control the FIB lens barrel 3, the SEM lens barrel 4, the detector 7, the detector stage 6, the sample stage 5, the deposition gas source, and the probe driving unit, respectively.

While the detector stage 6 is equipped with a rotating mechanism, the detector stage 6 can dispose the detector 7 at a predetermined position. The detector 7 can be rotated at a circumferential portion of the sample 1, while a normal of a plane which is constituted by the SEM lens barrel 4 and the FIB lens barrel 3 is defined as a rotation axis.

While an attitude of the sample 1 can be controlled by moving the sample stage 5 in a plane mode and a rotation mode, a sample plane of the sample 1 is directed to the SEM lens barrel 4 in the present embodiment. In order that penetration electrons can be detected, the sample plane of the sample 1 has already been made as a thin film. Then, while the rotating mechanism of the detector stage 6 is controlled by the calculating process unit, the detector 7 is disposed at a position corresponding to the SEM lens barrel 4 by sandwiching the sample stage 5, and the SEM lens barrel 4 and the detector 7 are disposed in such a manner that a major axis of the SEM lens barrel 4 and a major axis of the detector constitute a straight line. It should be noted that a position for disposing the detector may be freely determined if electrons and the like penetrated into the sample 1 are strongly detected at this disposing position.

An electron beam 9 generated by the SEM lens barrel 4 is entered/scanned over the sample 1. Penetration electrons of the sample 1 are detected by the detector 7 moved on an axis of the electron beam, and the detected penetration electrons are signal-processed, so that a penetration electron image of the sample is acquired.

Figure 2:
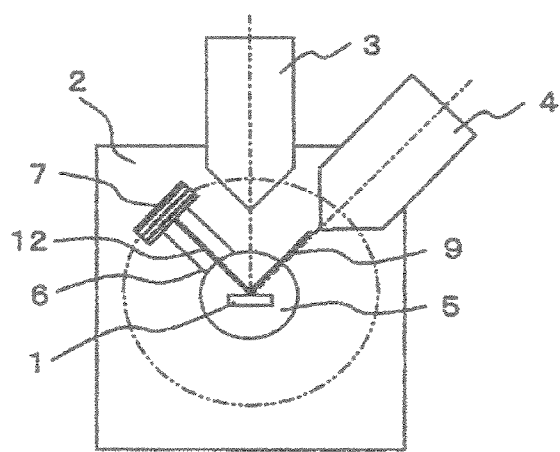
FIG. 2 is a system structural diagram of the FIB-SEM apparatus according to the embodiment 1.

In FIG. 2, the detector 7 is disposed by the detector stage 6 at an upper left portion on the paper plane, and is positioned at a place where the sample plane of the sample 1 is viewed. Also, the sample stage 5 is adjusted in such a manner that the sample plane of the sample 1 is directed to the direction of the FIB lens barrel 3. In other words, the detector 7, the FIB lens barrel 3, and the SEM lens barrel 4 are disposed on the same side with respect to the sample plane, and in such a manner that the optical axis of the SEM lens barrel 4 and the major axis of the detector have line symmetry with respect to the optical axis of the FIB lens barrel 3. It should be noted that a position for disposing the detector may be freely determined if secondary electrons and the like emitted from the sample 1 are strongly detected at this disposing position.

While the electron beam 9 generated by the SEM lens barrel 4 is entered/scanned over the sample 1, a signal 12 which is mainly secondary electrons is detected by the detector 7. During FIB processing/observation, the sample plane of the sample 1 can be SEM-observed without being directed to the direction of the SEM lens barrel 4. In the present apparatus, the position of the detector 7 can be adjusted in the very fine manner by the rotating mechanism of the detector stage 6, so that the signals can be detected at optimum arrangements in response to the directions of the sample plane, shapes of the sample, and the like.

Figure 3:
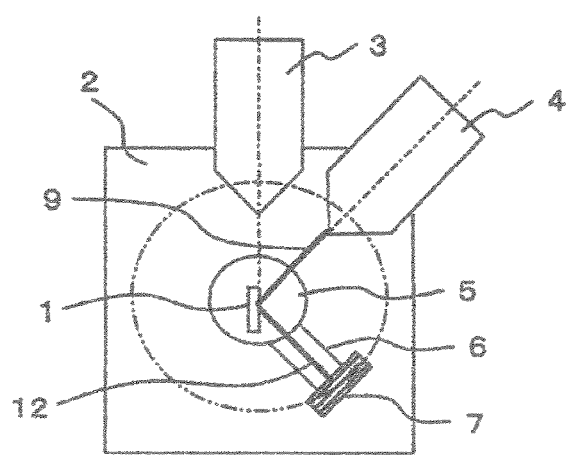
FIG. 3 is a system structural diagram of the FIB-SEM apparatus according to the embodiment 1.

In FIG. 3, the sample stage 5 is adjusted in such a manner that the sample plane of the sample 1 is located parallel to the FIB lens barrel 3. Also, the detector 7 is disposed by the detector stage 6 on a lower right portion on the paper plane, and is positioned at a place where the sample plane of the sample 1 is viewed. In other words, the detector 7 and the SEM lens barrel 4 are disposed on the same side with respect to the sample plane, and in such a manner that the optical axis of the SEM lens barrel 4 and the major axis of the detector have line symmetry with respect to a normal of the sample plane, through which the sample stage 5 passes. It should be noted that a position for disposing the detector may be freely determined if secondary electrons and the like emitted from the sample 1 are strongly detected at this disposing position.

While the electron beam 9 generated by the SEM lens barrel 4 is entered/scanned over the sample 1, a signal 12 which is mainly secondary electrons is detected by the detector 7. While the sample 1 is made in a thin film by irradiating a focused ion beam, the sample plane of the sample 1 can be SEM-observed.

Figure 4:
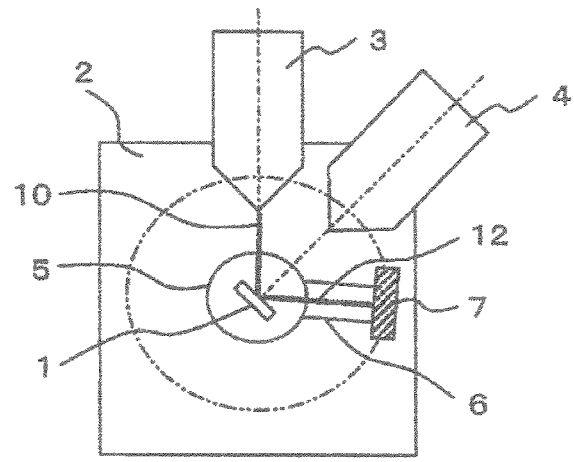
FIG. 4 is a system structural diagram of the FIB-SEM apparatus according to the embodiment 1.

FIG. 4 shows an example for detecting a signal generated by irradiating an ion beam such as secondary ions, secondary electrons, or the like. The detector 7 is disposed by the detector stage 6 at a right portion on the paper plane. Also, the sample stage 5 is adjusted in such a manner that the sample plane of the sample 1 is directed to the direction of the SEM lens barrel 4. Also, while the FIB lens barrel 3 and the detector 7 are disposed in such a manner that the sample plane of the sample 1 is viewed with respect to both the FIB lens barrel 3 and the detector 7, these structural elements are disposed in such a manner that the optical axis of the FIB lens barrel 3 and the major axis of the detector have line symmetry with respect to a normal of the sample plane. It should be noted that a position for disposing the detector may be freely determined if secondary electrons and the like emitted from the sample 1 are strongly detected at this disposing position.

While an ion beam 10 generated by the FIB lens barrel 3 is entered/scanned over the sample 1, a signal 12 which is mainly secondary ions is detected by the detector 7.

In the present embodiment, since the detector is rotated around the sample as the center, the optimum positions for detecting the signals which are determined based upon a direction and a shape of the sample can be adjusted. Also, only desirable detection signals of the reflection electrons, the penetration electrons, and the like can be selectively acquired.

It should also be noted that although the FIB lens barrel 3 has been vertically disposed and the SEM lens barrel 4 has been obliquely disposed in the present embodiment, the present invention is not limited only thereto, but alternatively, the FIB lens barrel 3 may be obliquely disposed and the SEM lens barrel 4 may be vertically disposed. Also, both the FIB lens barrel 3 and the SEM lens barrel 4 may be alternatively obliquely disposed. Further, such a triple column structure may be alternatively constructed with employment of a Ga focused ion beam column, an Ar focused ion beam column, and an electron beam column. Also, the rotating movement of the detector 7 may be alternatively realized by not only such a system that the detector 7 may be rotated more than 1 turn, but also another system that the detector 7 may be moved within a predetermined range in a similar manner to a pendulum. Also, the arrangements of the detector 7 may be alternatively realized not only by the rotating movement around the sample stage 5 as the center, but also by combining upper/lower/right/left movements with changing of an inclination angle.

Embodiment 2

A present embodiment is realized by furthermore adding a mechanism capable of moving the detector along a rotational radius direction to the rotating mechanism of the detector stage 6 explained in the embodiment 1, namely a mechanism by which a rotational radius can be changed. A description is mainly made of a different point from the embodiment 1.

Figure 5:
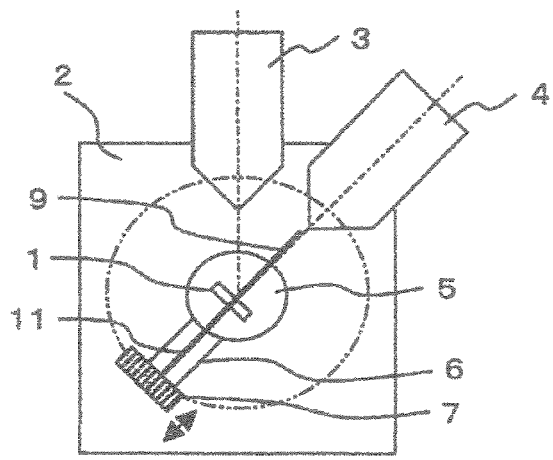
FIG. 5 is a system structural diagram of an FIB-SEM apparatus according to an embodiment 2.

FIG. 5 schematically indicates a charged particle beam apparatus of the present embodiment. In the present embodiment, although penetration electrons are detected by the same method as that of the embodiment 1, a relative distance between the sample 1 and the detector 7 can be changed by the moving mechanism for the rotational radius direction, which is additionally provided in the detector stage 6.

Figure 6:
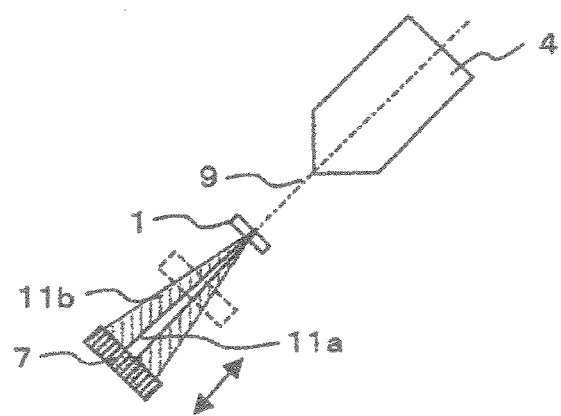
FIG. 6 is a diagram for showing the detecting principle of penetration electrons in the embodiment 2.

FIG. 6 shows the principle for detecting penetration electrons. The electron beam 9 generated by the SEM lens barrel 4 is entered/scanned over the sample 1, and penetration electrons 11 are detected by the detector 7. The penetration electrons are classified into two sorts of electrons, namely, bright-field penetration electrons 11a which are not largely scattered within the sample, and dark-field penetration electrons 11b which are scattered within the sample and penetrate into the sample, which are separately detected by sensors divided within the detector. Among these electrons, as to the latter-mentioned dark-field penetration electrons 11b, if the distance from the sample is changed by the detector stage 6, then a detecting angle of the scattered electrons is changed, so that a Z contrast observation can be carried out by separating the sample stage 7 apart from the sample 1 so as to increase the detecting angle.

Also, in the case that the reflection electrons are detected as represented in FIG. 2, FIG. 3, and FIG. 4, the detector 7 is moved close to the sample 1 so as to adjust the distance between the detector 7 and the sample 1, so that optimum signal strengths can be obtained.

Embodiment 3

A present embodiment is realized by adding an evacuating mechanism for a rotation axial direction with respect to the moving mechanism for moving the detector stage 6 in the rotation direction and the rotational radius direction explained in the embodiment 1 and the embodiment 2. A description is mainly made of a different point from the embodiment 1 and the embodiment 2.

Figure 7:
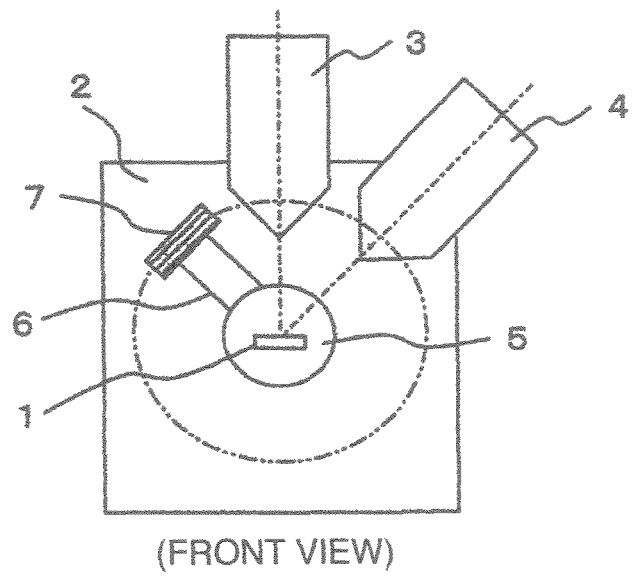
FIG. 7 is a system structural diagram of an FIB-SEM apparatus according to an embodiment 3.
Figure 7:
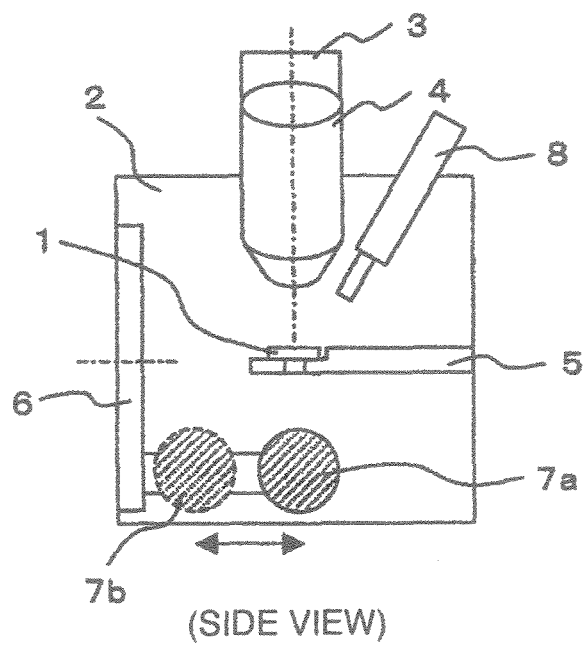

FIG. 7 schematically shows a charged particle beam apparatus of the present embodiment. The present embodiment is a third embodiment. As shown by a side view of FIG. 7, a detector of the present embodiment can be moved between an observation position and an evacuation position. At the observation position, a detector 7a is present on a plane which includes the optical axes of the FIB lens barrel 3 and the SEM lens barrel, and the sample stage 5. At the evacuation position, a detector 7b is present near a wall of the sample chamber 2, which is located opposite to another wall thereof where the sample stage 5 and a deposition gas gun 8 are mounted.

In the present apparatus, while in order that a protection film is formed and a sample piece is connected to a probe when an FIB process is carried out, the deposition gas gun 8 is additionally provided which is employed to eject a deposition gas supplied from the deposition gas source to a pre-determined position within the sample chamber, a circumferential environment when the deposition gas is injected is under such a situation that contamination adhesions caused by the gas may readily occur.

As a consequence, when the deposition gas is injected, since the detector 7 is temporarily evacuated by the evacuating mechanism in a direction along which the detector 7 is separated from the sample, a deterioration in performance of the detector 7 caused by the contamination can be avoided. Also, when the detector stage 6 is moved, since the detector 7 is evacuated by the evacuating mechanism on the side of the sample chamber, it is possible to prevent interference of the detector 7 with respect to other units such as the sample stage, the SEM lens barrel, and the FIB lens barrel.

REFERENCE SIGNS LIST 1 sample
2 sample chamber
3 FIB lens barrel
4 SEM lens barrel
5 sample stage
6 detector stage
7 detector
8 deposition gas gun
9 electron beam
10 ion beam
11 penetration electrons
12 signal

The invention claimed is:

1. A charged particle beam apparatus comprising: an electron beam optical system for irradiating an electron beam, an ion beam optical system for irradiating an ion beam, a rotatable sample stage, and a detector for detecting a signal from a sample, wherein:
the sample is disposed at a cross point of the electron beam optical system and the ion beam optical system, said detector is disposed on a detector stage, which is equipped with a rotating mechanism, and by the rotating mechanism, said detector is movable to a detective position for detecting a transmission electron which has passed through the sample by irradiating the electron beam and a detective position for detecting a secondary signal which has been emitted from the sample by irradiating the ion beam.

2. A charged particle beam apparatus as claimed in claim 1, wherein:
said detector is rotatable around a normal of a plane which is constituted by the electron beam optical system and the ion beam optical system.

3. A charged particle beam apparatus as claimed in claim 2 wherein:
the sample stage is rotated with respect to the electron beam optical system or the ion beam optical system, and said detector is moved in response to rotation of the sample stage.

4. The charged particle beam apparatus according to claim 2, wherein
the detector is movable along a rotational radius direction.

5. The charged particle beam apparatus according to claim 1, wherein
a detective surface of the detector is divided.

6. The charged particle beam apparatus according to claim 1, wherein
the detector is movable to an evacuation position.

* * * * *